United States Patent
Iwasaki et al.

(10) Patent No.: US 12,341,420 B2
(45) Date of Patent: Jun. 24, 2025

(54) ELECTRONIC CONTROL DEVICE FOR POWER CONVERSION, AND POWER SUPPLY IC

(71) Applicant: Hitachi Astemo, Ltd., Hitachinaka (JP)

(72) Inventors: Mitsuhiro Iwasaki, Hitachinaka (JP); Masahiro Doi, Hitachinaka (JP); Takeo Yamashita, Hitachinaka (JP); Hitomi Aoyama, Hitachinaka (JP); Shinichirou Hida, Hitachinaka (JP)

(73) Assignee: HITACHI ASTEMO, LTD., Ibaraki (JP)

( * ) Notice: Subject to any disclaimer, the term of this patent is extended or adjusted under 35 U.S.C. 154(b) by 219 days.

(21) Appl. No.: 17/911,023

(22) PCT Filed: Dec. 28, 2020

(86) PCT No.: PCT/JP2020/049085
§ 371 (c)(1),
(2) Date: Sep. 12, 2022

(87) PCT Pub. No.: WO2021/181837
PCT Pub. Date: Sep. 16, 2021

(65) Prior Publication Data
US 2023/0114063 A1 Apr. 13, 2023

(30) Foreign Application Priority Data
Mar. 13, 2020 (JP) .................... 2020-044443

(51) Int. Cl.
*H02M 1/32* (2007.01)
*H02M 1/08* (2006.01)
(Continued)

(52) U.S. Cl.
CPC ............... *H02M 1/32* (2013.01); *H02M 1/08* (2013.01); *H02M 7/48* (2013.01); *H02P 27/06* (2013.01);
(Continued)

(58) Field of Classification Search
CPC . H02M 1/32; H02M 1/08; H02M 7/48; H02P 27/06; H02P 29/024; H03K 19/173
See application file for complete search history.

(56) References Cited

U.S. PATENT DOCUMENTS 5,969,919 A 10/1999 Kobayashi et al.
6,058,036 A 5/2000 Endo et al.
(Continued)

FOREIGN PATENT DOCUMENTS

EP 1149754 B1 2/2004
JP 10-191646 A 7/1998
(Continued)

OTHER PUBLICATIONS

International Search Report and Written Opinion, PCT/JP2020/049085, dated Apr. 20, 2021, 6 pgs.
(Continued)

*Primary Examiner* — Kyle J Moody
(74) *Attorney, Agent, or Firm* — Volpe Koenig

(57) ABSTRACT

An electronic control device for power conversion having an integrated safety function and improved reliability includes: a power module for converting DC power into AC power and supply the AC power to a motor; a gate driver for controlling the power module; a microcontroller for controlling the gate driver; a power supply IC for supplying power to at least one of the gate driver and the microcontroller; a discharge circuit for discharging a high voltage supplied to the power module; and a sensor. The power supply IC includes a microcomputer abnormality detection
(Continued)

circuit for detecting an abnormality of the microcontroller and a safety processing circuit for determining necessity of safety processing based on an output of at least one of the microcomputer abnormality detection circuit and the sensor and performs the safety processing. The safety processing circuit stops the motor or discharges a high voltage using the discharge circuit.

14 Claims, 14 Drawing Sheets

(51) Int. Cl.
    *H02M 7/48*       (2007.01)
    *H02P 27/06*      (2006.01)
    *H02P 29/024*    (2016.01)
    *H03K 19/173*   (2006.01)

(52) U.S. Cl.
    CPC ......... *H02P 29/024* (2013.01); *H03K 19/173* (2013.01)

(56) References Cited

U.S. PATENT DOCUMENTS

| | | | |
|---|---|---|---|
| 11,183,918 B2* | 11/2021 | Yamamura | ............ H02P 29/024 |
| 2012/0065823 A1 | 3/2012 | Taguchi et al. | |
| 2014/0095005 A1 | 4/2014 | Kanzaki et al. | |
| 2016/0134289 A1 | 5/2016 | Lesea | |
| 2017/0274776 A1* | 9/2017 | Xu | .......................... B60L 50/10 |
| 2020/0036315 A1 | 1/2020 | Sato et al. | |
| 2021/0111656 A1* | 4/2021 | Hirakata | ................. H02M 1/32 |

FOREIGN PATENT DOCUMENTS

| | | |
|---|---|---|
| JP | 2009-254088 A | 10/2009 |
| JP | 2012-257415 A | 12/2012 |
| JP | 2015-133783 A | 7/2015 |
| JP | 2017-536041 A | 11/2017 |

OTHER PUBLICATIONS

Extended European Search Report issued on Feb. 16, 2024 for European Patent Application No. 20924897.0.

Communication pursuant to Article 94(3) EPC issued on Feb. 6, 2025 for European Patent Application No. 1 20924897.0.

* cited by examiner

ELECTRONIC CONTROL DEVICE FOR POWER CONVERSION, AND POWER SUPPLY IC

TECHNICAL FIELD

The present invention relates to an electronic control device for power conversion and a power supply IC.

BACKGROUND ART

An electric motor vehicle includes a high-voltage battery for driving a motor in addition to a low-voltage battery for operating an electronic control device or the like mounted on the vehicle. In electric motor vehicles, the number of places where voltage monitoring, current monitoring, and temperature monitoring are performed is increased as compared with vehicles that move only by a conventional internal combustion engine. Further, an electric motor vehicle is required to have a control function for safely handling a high voltage and various control functions for safely stopping a motor or the like when an abnormality occurs. These various monitoring and control functions are mounted on an electronic control device for power conversion for an electric motor vehicle. However, many IC components are required, and there are problems of an increase in device cost and ensuring reliability of individual IC components.

PTL 1 discloses a device that includes: a plurality of programmable hardware resources disposed in an integrated circuit (IC) die; an analog-to-digital converter (ADC) disposed in the IC die and configured to quantize values of one or more analog parameters of the IC die; a configuration control circuit disposed in the IC die and configured to program the programmable hardware resources to mount, in response to a set of configuration data, a set of circuits specified by the set of configuration data and to connect the ADC to respective nodes of the IC die to sample the one or more analog parameters; and an interface circuit configured to be coupled to the ADC and generate a control signal based on quantized values of the one or more analog parameters from the ADC, and output the control signal to a power supply coupled to a power terminal of the IC die.

CITATION LIST

Patent Literature

PTL 1: JP 2017-536041 T

SUMMARY OF INVENTION

Technical Problem

In the invention described in PTL 1, there is room for improvement in reliability.

Solution to Problem

An electronic control device for power conversion according to a first aspect of the present invention includes: a power module configured to convert DC power into AC power and supply the AC power to a motor; a gate driver configured to control the power module; a microcontroller configured to control the gate driver; a power supply IC configured to supply power to at least one of the gate driver and the microcontroller; a discharge circuit configured to discharge a high voltage supplied to the power module; and a sensor. The power supply IC includes a microcomputer abnormality detection circuit configured to detect an abnormality of the microcontroller and a safety processing circuit configured to determine necessity of safety processing based on an output of at least one of the microcomputer abnormality detection circuit and the sensor and performs the safety processing. The safety processing circuit stops the motor or discharges a high voltage using the discharge circuit.

A power supply IC according to a second aspect of the present invention is provided in the above-described electronic control device for power conversion.

Advantageous Effects of Invention

According to the present invention, since the safety function is integrated into a power supply IC, reliability can be improved.

DESCRIPTION OF EMBODIMENTS

Figure 1:
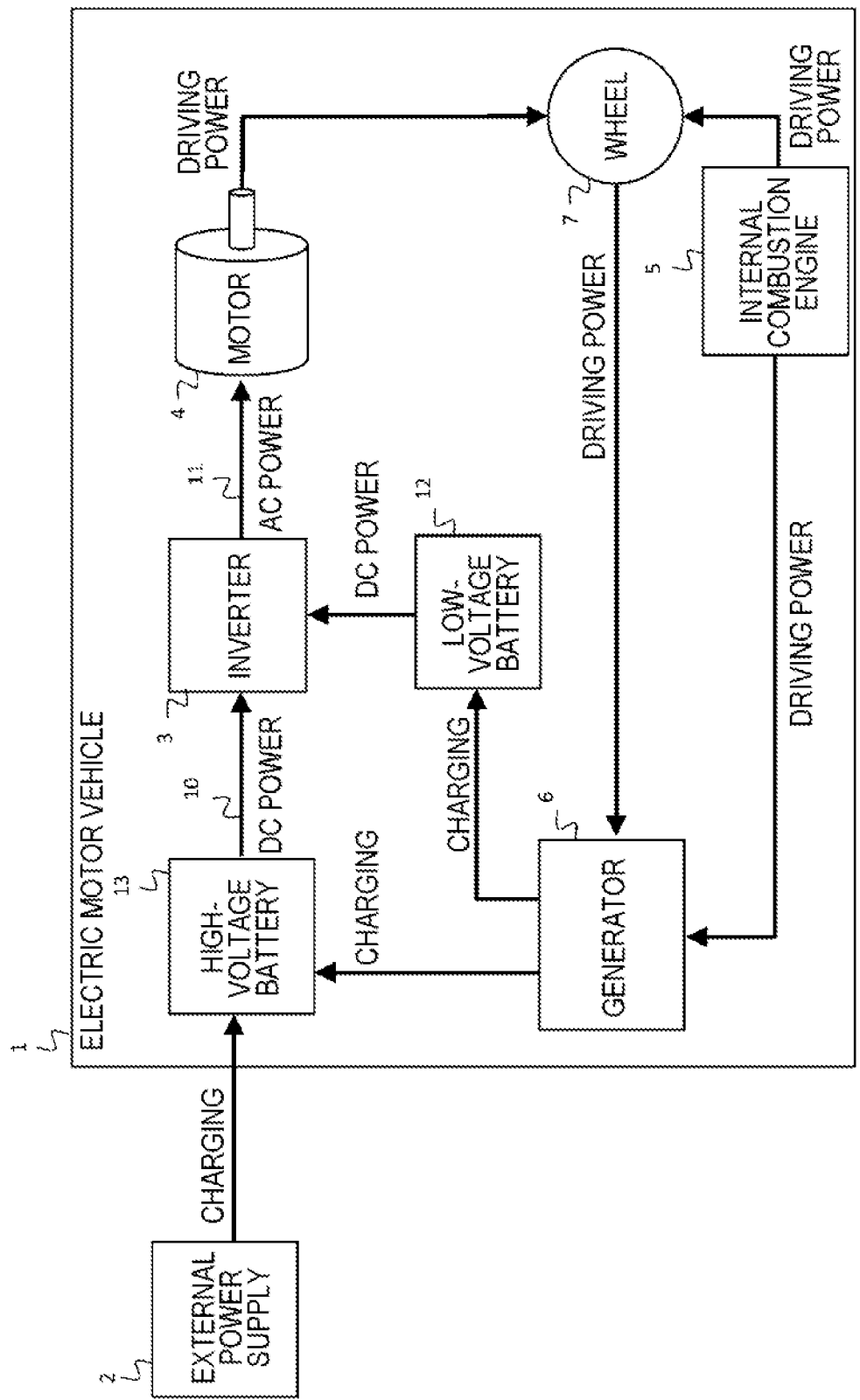
FIG. 1 is a diagram illustrating a schematic configuration of an electric motor vehicle.

Before describing individual embodiments, representative components of an electric motor vehicle will be described. FIG. 1 is a schematic configuration diagram of an electric motor vehicle. An electric motor vehicle 1 includes a high-voltage battery 13, an inverter 3, a motor 4, an internal combustion engine 5, a generator 6, a low-voltage battery 12, and wheels 7. The high-voltage battery 13 is charged by driving the generator 6 by the driving power of the internal combustion engine 5 such as a gasoline engine or the motor 4, or is charged by an external power supply 2.

In addition, the inverter 3 is a particularly important component that performs appropriate control of power in order to drive the electric motor vehicle 1. While the power that can be taken out from the high-voltage battery 13 is DC power 10, the motor 4 mounted on the electric motor vehicle 1 generally needs to be moved using AC power 11. The inverter 3 is driven by the low-voltage battery 12, converts the DC power 10 supplied from the high-voltage battery 13 into the AC power 11, and drives and controls the motor 4. Therefore, the inverter 3 can also be referred to as an electronic control device for power conversion. The motor 4 is controlled by the inverter 3, and transmits the generated driving power to the wheels 7 to drive the electric motor vehicle 1.

Figure 2:
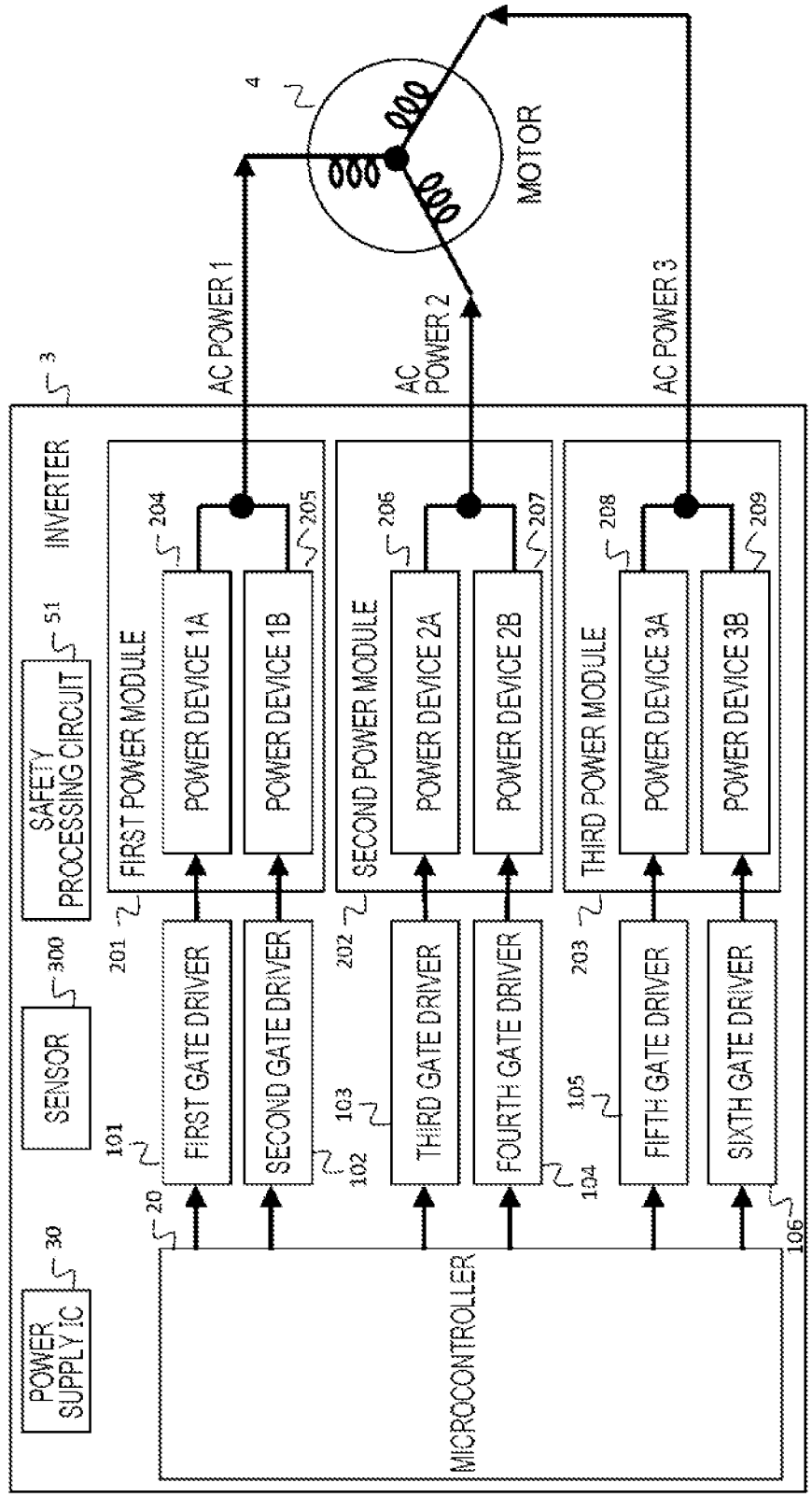
FIG. 2 is a schematic diagram illustrating connection between an inverter and a motor.

FIG. 2 is a schematic diagram illustrating connection between the inverter 3 and the motor 4. The motor 4 used in the electric motor vehicle 1 is a three-phase AC motor, and operates with three types of AC power having different phases as inputs. Therefore, three power modules that supply AC power to the motor 4, that is, a first power module 201, a second power module 202, and a third power module 203 are mounted on the inverter 3.

These power modules have a main function of converting DC power into AC power in the inverter 3. In the power module, two sets of power devices such as insulated gate bipolar transistors (IGBTs) and metal oxide-semiconductor field effect transistors (MOSFETs) are mounted. Specifically, the first power module 201 includes a power device 1A indicated by reference numeral 204 and a power device 1B indicated by reference numeral 205. The second power module 202 includes a power device 2A indicated by reference numeral 206 and a power device 2B indicated by reference numeral 207. The third power module 203 includes a power device 3A indicated by reference numeral 208 and a power device 3B indicated by reference numeral 209.

By switching the power devices denoted by reference numerals 204 to 209, AC currents flowing through the motor 4 are output and controlled, and conversion from DC power to AC power is performed. Each of the power devices denoted by reference numerals 204 to 209 is controlled by each of a first gate driver 101 to a sixth gate driver 106. Each of the first gate driver 101 to the sixth gate driver 106 is controlled by a microcontroller 20. The microcontroller 20 controls each of the first gate driver 101 to the sixth gate driver 106 to change the frequency of the AC power generated by each power module and control the rotation speed of the motor 4.

Figure 3:
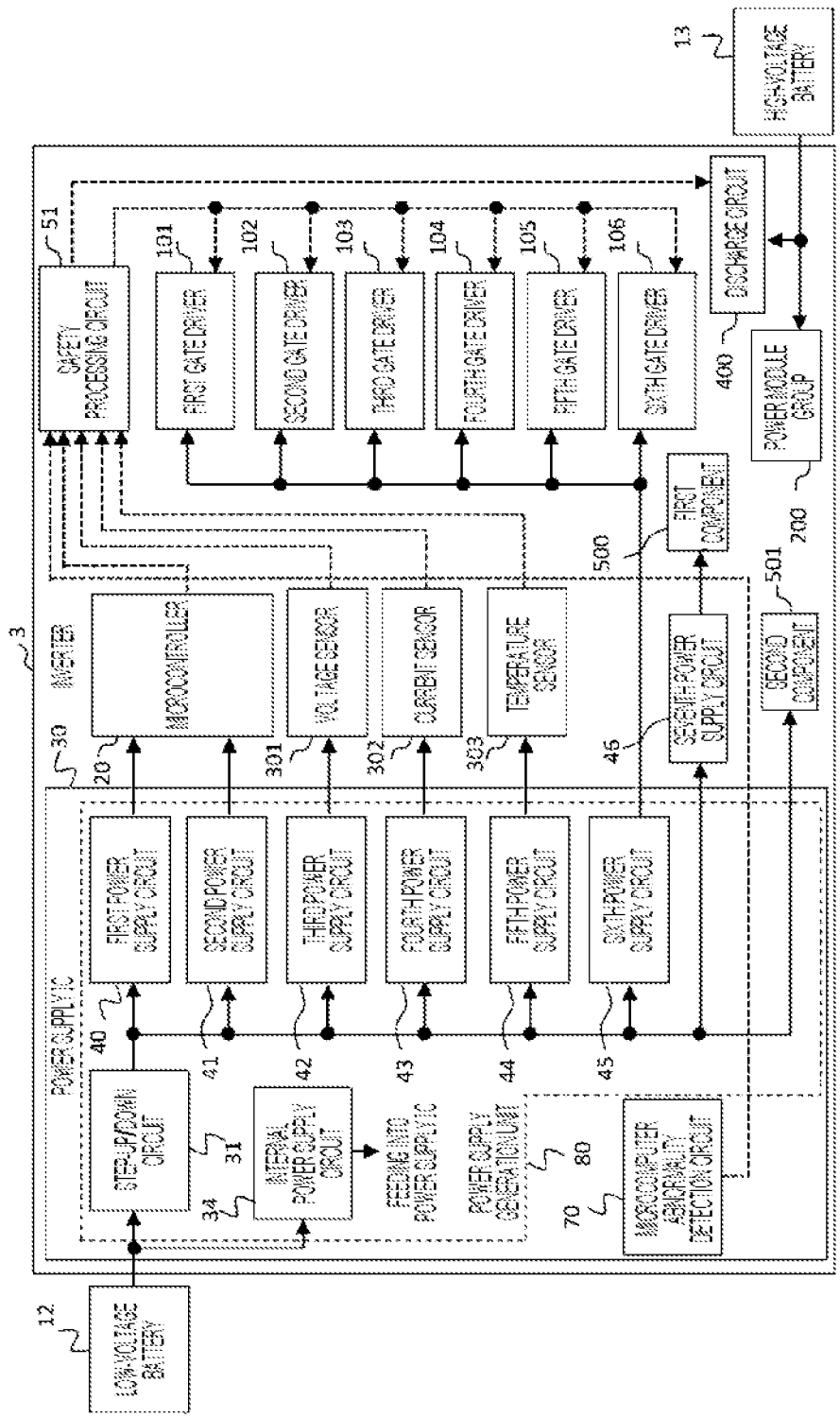
FIG. 3 is a diagram illustrating a configuration of an inverter focusing on power supply.

FIG. 3 is a diagram illustrating a configuration of the inverter 3 focusing on power supply. However, FIG. 3 mainly illustrates a flow of power and a flow of control of a safety processing circuit. The inverter 3 includes a power supply IC 30, the microcontroller 20, a voltage sensor 301, a current sensor 302, a temperature sensor 303, a safety processing circuit 51, and the first gate driver 101 to the sixth gate driver 106. The power supply IC 30 has a function of supplying stable power in accordance with components and circuits incorporated in the inverter 3.

The power supply IC 30 includes a power supply generation unit 80 and a microcomputer abnormality detection circuit 70. The power supply generation unit 80 includes a step-up/down circuit 31, an internal power supply circuit 34, a first power supply circuit 40, a second power supply circuit 41, a third power supply circuit 42, a fourth power supply circuit 43, a fifth power supply circuit 44, and a sixth power supply circuit 45. The power supply IC 30 receives power from the low-voltage battery 12, raises or lowers a voltage level through the step-up/down circuit 31, adjusts characteristics using the first power supply circuit 40 to the sixth power supply circuit 45, and supplies the power to the outside. In addition, the power supply IC 30 receives the power from the low-voltage battery 12, adjusts a voltage level through the internal power supply circuit 34, and supplies the power to the inside of the power supply IC 30. For example, the microcomputer abnormality detection circuit 70 is not connected to the internal power supply circuit 34 for convenience of illustration, but the microcomputer abnormality detection circuit 70 is actually fed with power from the internal power supply circuit 34.

The first power supply circuit 40 and the second power supply circuit 41 supply power having different characteristics to the microcontroller 20. The third power supply circuit 42 supplies power to the voltage sensor 301. The fourth power supply circuit 43 supplies power to the current sensor 302. The fifth power supply circuit 44 supplies power to the temperature sensor 303. The sixth power supply circuit 45 supplies power to the first gate driver 101 to the sixth gate driver 106. The power output from the step-up/down circuit 31 may be directly supplied to the outside without passing through any power supply circuit. In addition, the power output to the outside of the power supply IC 30 without passing through any power supply circuit may be further supplied to the components and circuits built in the inverter 3 through a seventh power supply circuit 46.

The number of power supply circuits mounted on the power supply IC 30 needs to be supplied from the power supply IC 30, and is required by the number of powers having different characteristics required outside the power supply IC 30. For example, when the characteristics of the power to be supplied to the voltage sensor 301, the current sensor 302, and the temperature sensor 303 may be the same, the fourth power supply circuit 43 and the fifth power supply circuit 44 can be deleted.

The safety processing circuit 51 is configured by a programmable circuit such as a field-programmable gate array (FPGA) or a complex programmable logic device (CPLD). The safety processing circuit 51 is connected to the microcontroller 20, the voltage sensor 301, the current sensor 302, the temperature sensor 303, and the microcomputer abnormality detection circuit 70, and detects an abnormality occurring in the microcontroller 20 or the like by a known method. The safety processing circuit 51 performs safety processing when detecting an abnormality in any of the microcontrollers 20 and the like. The safety processing is at least one of operating a discharge circuit 400 to discharge a high voltage and stopping the first gate driver 101 to the sixth gate driver 106 to stop the motor 4.

The microcomputer abnormality detection circuit 70 is realized using, for example, a watchdog timer included in the power supply IC 30. The microcomputer abnormality detection circuit 70 detects an abnormality of the microcontroller 20 using communication such as serial peripheral interface (SPI) communication between the microcontroller 20 and the power supply IC 30. Upon detecting an abnormality, the microcomputer abnormality detection circuit 70 resets the microcontroller 20, for example. For specific abnormality detection by the microcomputer abnormality detection circuit 70, for example, the power supply IC 30 transmits a problem to the microcontroller 20 in response to a request from the microcontroller 20, continuously diagnoses whether the answer from the microcontroller 20 is correct, whether the answer is made at an appropriate timing, and the like, and outputs a reset signal to stop the microcontroller 20 when a counter value increased or decreased by the abnormality detection exceeds a certain value.

The representative configuration of the electric motor vehicle has been described above. In various embodiments described below, differences from the representative configurations described above will be mainly described.

First Embodiment

Figure 4:
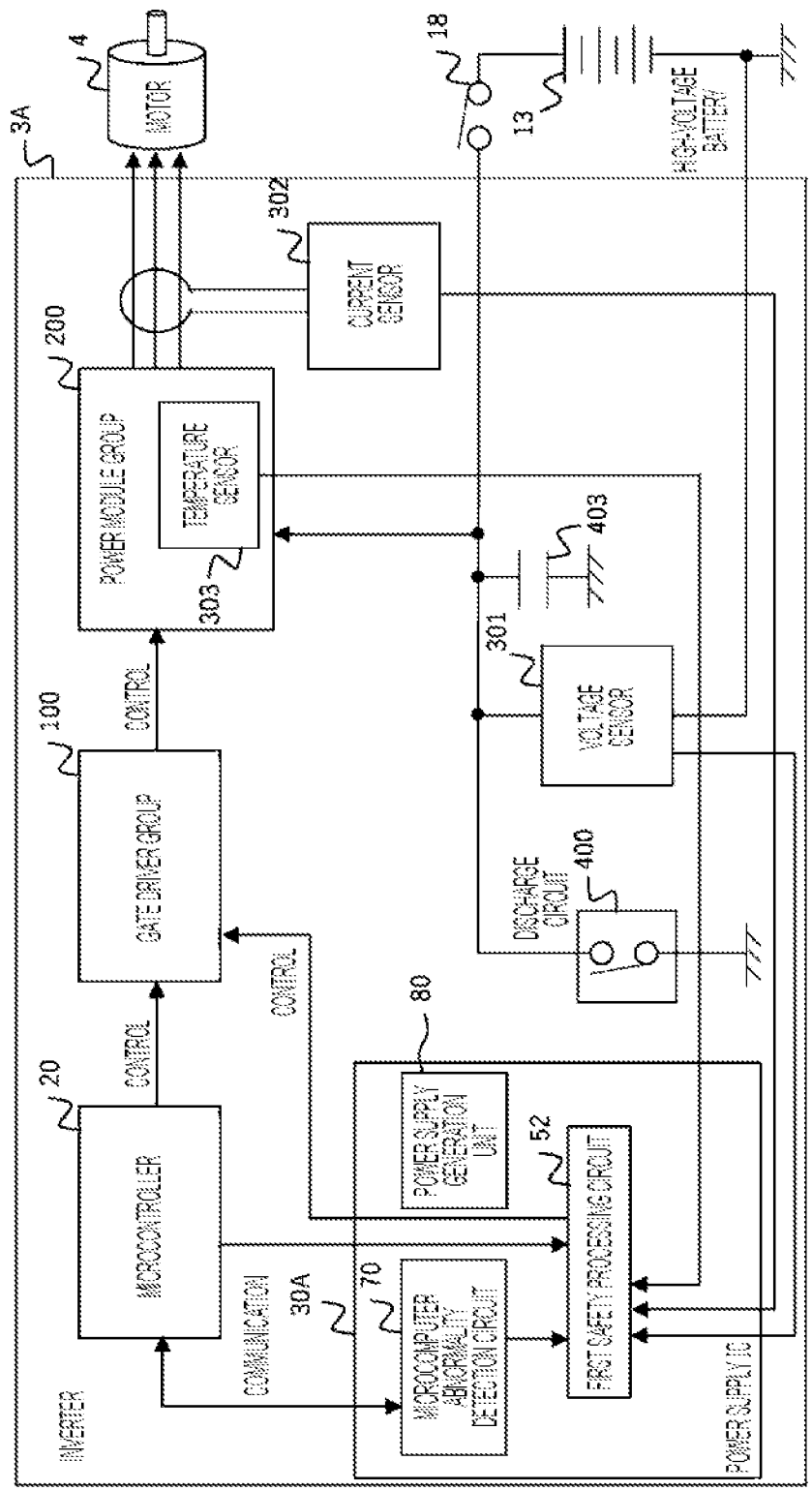
FIG. 4 is a block diagram illustrating a configuration of an inverter in a first embodiment.

FIG. 4 is a configuration diagram of an inverter 3A in a first embodiment. The inverter 3A includes a power supply IC 30A that supplies power to the outside, a power module group 200 that supplies power to the motor 4, a gate driver group 100 that controls the power module group 200, the microcontroller 20 that controls the gate driver group 100, the voltage sensor 301 that observes a voltage supplied to the power module group 200, the discharge circuit 400 that discharges a high voltage supplied to the power module group 200 from a capacitor 403, and the current sensor 302 that observes a current supplied to the motor 4. Although details of the power supply generation unit 80 are omitted in FIG. 4, power is fed from the step-up/down circuit 31 of the power supply generation unit 80 and the internal power supply circuit 34 to each component of the power supply IC 30 as described in FIG. 3.

The power module group 200 in FIG. 4 corresponds to a group of the first power module 201 to the third power module 203 in FIG. 2. The gate driver group 100 in FIG. 4 corresponds to a group of the first gate driver 101 to the sixth gate driver 106 in FIG. 2. The power supply IC 30A in FIG. 4 corresponds to the power supply IC 30 in FIGS. 2 and 3. The power supply IC 30A according to the present embodiment includes a first safety processing circuit 52 in addition to the configuration of the power supply IC 30 in FIGS. 2 and 3. The first safety processing circuit 52 corresponds to the safety processing circuit 51 in FIG. 3.

The power module group 200 includes the temperature sensor 303 for measuring the temperature of the power module. As normal inverter control, the microcontroller 20 controls the gate driver group 100 so as to achieve desired motor drive from the signals of the current sensor 302, the voltage sensor 301, and the temperature sensor 303 illustrated in FIG. 4, but the sensor signal is omitted in FIG. 4 and subsequent drawings. The first safety processing circuit 52 of the power supply IC 30A controls the gate driver group 100 based on at least one of the outputs of the temperature sensor 303, the voltage sensor 301, the current sensor 302, the microcomputer abnormality circuit detection 70, and the microcontroller 20 to perform safety processing. However, the safety processing in the present embodiment is to safely stop the motor 4. Details will be described below.

The power supply IC 30A includes a communication interface that communicates with the microcontroller 20. This communication interface corresponds to, for example, a communication standard such as SPI or I2C. The microcontroller 20 periodically communicates with the power supply IC 30A during operation. The microcomputer abnormality detection circuit 70 of the power supply IC 30A also has a function of a watchdog timer including a counter. This watchdog timer increases the value of the counter, for example, every certain period, and decreases the value of the counter when the power supply IC 30A and the microcontroller 20 perform fixed exchange. When the value of the counter exceeds a threshold set by a user, the microcomputer abnormality detection circuit 70 determines that an abnormality has occurred in the microcontroller 20 and notifies the first safety processing circuit 52 of the occurrence of the abnormality. The first safety processing circuit 52 notified of the occurrence of the abnormality stops the motor 4.

The temperature sensor 303 is installed in the power module group 200. The temperature sensor 303 is, for example, a sensor using a diode. When the temperature measured by the temperature sensor 303 exceeds a temperature set in advance in the power supply IC 30A, that is, a maximum rated temperature of the power module group 200, the first safety processing circuit 52 determines that the temperature is abnormal and stops the motor 4. However, the temperature at which the first safety processing circuit 52 determines that the temperature is abnormal only needs to be set based on the maximum rated temperature, and may be a temperature several degrees lower than the maximum rated temperature.

The voltage sensor 301 uses, for example, an amplifier, and observes the voltage value of the high-voltage battery 13 by checking a signal at a lower level proportional to the voltage of the high-voltage battery 13. When the voltage observed by the voltage sensor 301 is lower than the operating voltage of the inverter 3A, the first safety processing circuit 52 determines that the voltage is abnormal and stops the motor 4. The current sensor 302 is, for example, a sensor using a Hall element, and observes a current supplied to the motor 4. When the current observed by the current sensor 302 exceeds a maximum rated current of the motor 4, the first safety processing circuit 52 determines that the current is abnormal and stops the motor 4.

According to the first embodiment described above, the following operational effects can be obtained.

(1) The inverter 3A, which is an electronic control device for power conversion, includes the power module group 200 that converts DC power into AC power and supplies the AC power to the motor 4, the gate driver group 100 that controls the power module group 200, the power supply IC 30A that supplies power to the gate driver group 100 and the microcontroller 20, the microcontroller 20 that controls the gate driver group 100, the discharge circuit 400 that discharges a high voltage supplied to the power module group 200, the voltage sensor 301, the current sensor 302, and the temperature sensor 303. The power supply IC 30A includes a reset signal according to a command from the microcontroller 20, the microcomputer abnormality detection circuit 70 that detects an abnormality of the microcontroller 20, and the first safety processing circuit 52 that determines necessity of safety processing based on an output of at least one of a plurality of sensors and performs the safety processing.

Therefore, since the inverter 3A integrates the safety function into the power supply IC 30A, the reliability can be improved since there is no disconnection in the middle of the signal as compared with the case where the safety function is provided outside the power supply IC 30A. For example, in a case where the safety function is realized by a safety function IC separately provided, a signal line and a power feeding line are required between the power supply IC and the safety function IC, and the safety function cannot be used even if any of the signal line and the power feeding line is disconnected, and the reliability is inferior to that of the present embodiment. In addition, as compared with the case of using the safety function IC, in the present embodiment, the number of components is reduced and the wiring pattern is reduced, so that the manufacturing cost can be reduced.

(2) The sensors provided in the inverter 3A are the temperature sensor 303 that measures the temperature of the power module group 200, the current sensor 302 that measures the current supplied to the motor 4, and the voltage sensor 301 that measures the high voltage. The first safety processing circuit 52 directly controls the gate driver group 100 without depending on the microcontroller 20 as safety processing, controls the operation of the power module group 200, and safely stops the motor 4. For example, by off-controlling all the power devices of the power module group 200 or on-controlling some of the power devices, the output of the AC current flowing to the motor 4 is stopped, and the driving of the motor 4 is stopped.

First Modification

The first safety processing circuit 52 may cause the first power supply circuit 40 to the sixth power supply circuit 45 of the power supply generation unit 80 to cut off the output when detecting an abnormality. In particular, by cutting off the power feeding to the sixth power supply circuit 45 that feeds power to the gate driver group 100, the generation of the AC power by the power module group 200 is not performed, so that the motor 4 is stopped.

According to the first modification, the following operational effects can be obtained.

(3) The first safety processing circuit 52 cuts off power feeding to the gate driver group 100 as safety processing. Therefore, the motor 4 can be stopped without depending on the microcontroller 20, and the same effect as the first safety processing circuit 52 directly controls the gate driver group 100 to stop the operation of the power module group 200 can be obtained.

Second Embodiment

A second embodiment of the inverter will be described with reference to FIG. 5. In the following description, the same components as those on the first embodiment are denoted by the same reference numerals, and differences will be mainly described. The points that are not particularly described are the same as in the first embodiment. The present embodiment is different from the first embodiment mainly in ensuring safety by discharge.

Figure 5:
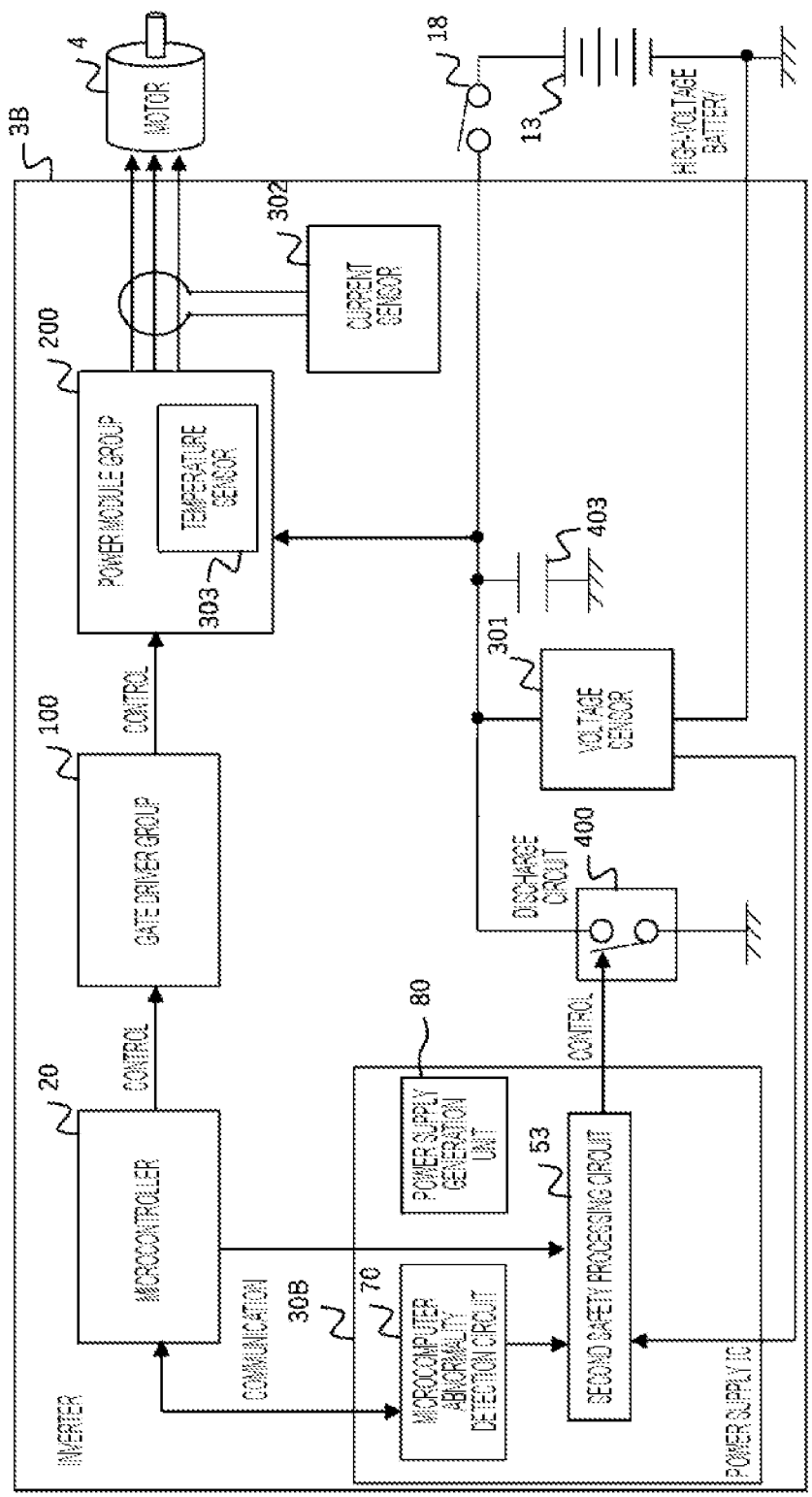
FIG. 5 is a block diagram illustrating a configuration of an inverter in a second embodiment.

FIG. 5 is a configuration diagram of an inverter 38 in the second embodiment. The main differences from FIG. 4 in the first embodiment are that a power supply IC 30B includes a second safety processing circuit 53 instead of the first safety processing circuit 52, and that a sensor to be used is different. The second safety processing circuit 53 receives outputs of the voltage sensor 301, the microcontroller 20, and the microcomputer abnormality detection circuit 70. That is, in the present embodiment, the outputs of the current sensor 302 and the temperature sensor 303 need not be input to the power supply IC 30B. Therefore, in the present embodiment, the inverter 3B may not include the current sensor 302 and the temperature sensor 303.

When the reset signal from the microcontroller 20 and the abnormality occurrence of the microcontroller 20 are notified from the microcomputer abnormality detection circuit 70, the second safety processing circuit 53 performs safety processing according to the output of the voltage sensor 301. The safety processing executed by the second safety processing circuit 53 is to cause the discharge circuit 400 to perform discharging. However, the second safety processing circuit 53 may operate by receiving an output from only one of the microcontroller 20 and the microcomputer abnormality detection circuit 70.

According to the second embodiment described above, the following operational effects can be obtained.

(4) The sensor included in the inverter 3B is a voltage sensor 301 that measures a high voltage. The second safety processing circuit 53 causes the discharge circuit 400 to perform discharging as safety processing. Therefore, reliability of an important function related to functional safety such as a control function for safely handling a high voltage can be improved.

Third Embodiment

A third embodiment of the inverter will be described with reference to FIG. 6. In the following description, the same components as those on the first embodiment are denoted by the same reference numerals, and differences will be mainly described. The points that are not particularly described are the same as in the first embodiment. The present embodiment is different from the first embodiment mainly in that the first safety processing circuit 52 and the second safety processing circuit 53 are provided.

Figure 6:
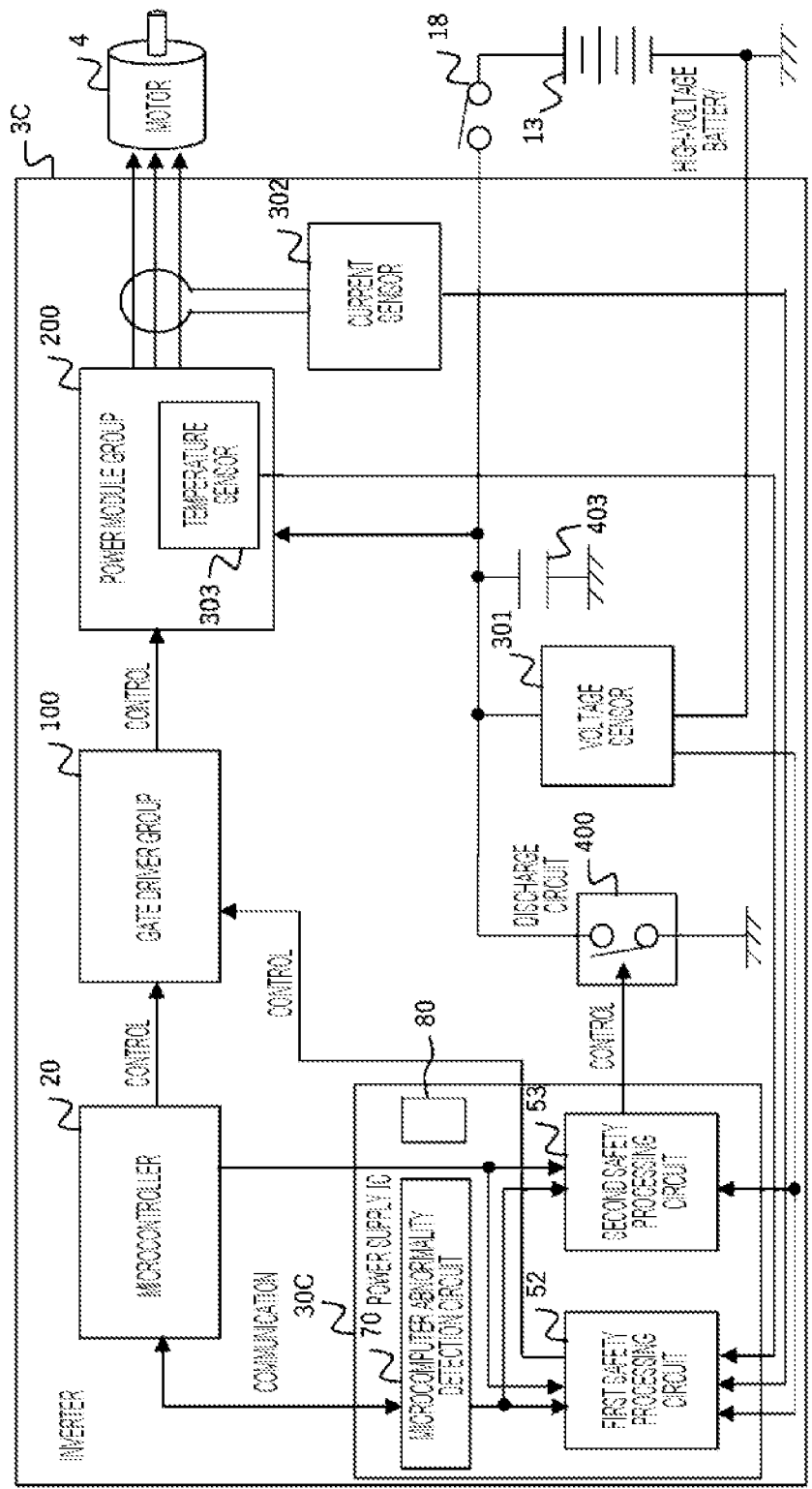
FIG. 6 is a block diagram illustrating a configuration of an inverter in a third embodiment.

FIG. 6 is a configuration diagram of an inverter 30 in the third embodiment. A power supply IC 30C of the inverter 3C in the present embodiment includes the first safety processing circuit 52 and the second safety processing circuit 53. The operation of the first safety processing circuit 52 is as described in the first embodiment. The operation of the second safety processing circuit 53 is as described in the second embodiment. Therefore, the safety processing in the present embodiment refers to safely stopping the motor 4 and discharging a high voltage.

According to the third embodiment described above, the following operational effects can be obtained.

(5) The inverter 3C includes the first safety processing circuit 52 and the second safety processing circuit 53. Therefore, the inverter 30 can stop the motor 4 and discharge a high voltage as safety processing.

Fourth Embodiment

A fourth embodiment of the inverter will be described with reference to FIG. 7. In the following description, the same components as those of the third embodiment are denoted by the same reference numerals, and differences will be mainly described. The points not specifically described are the same as those in the third embodiment. In the present embodiment, two systems of power are mainly supplied to the first safety processing circuit 52 and the second safety processing circuit 53.

Figure 7:
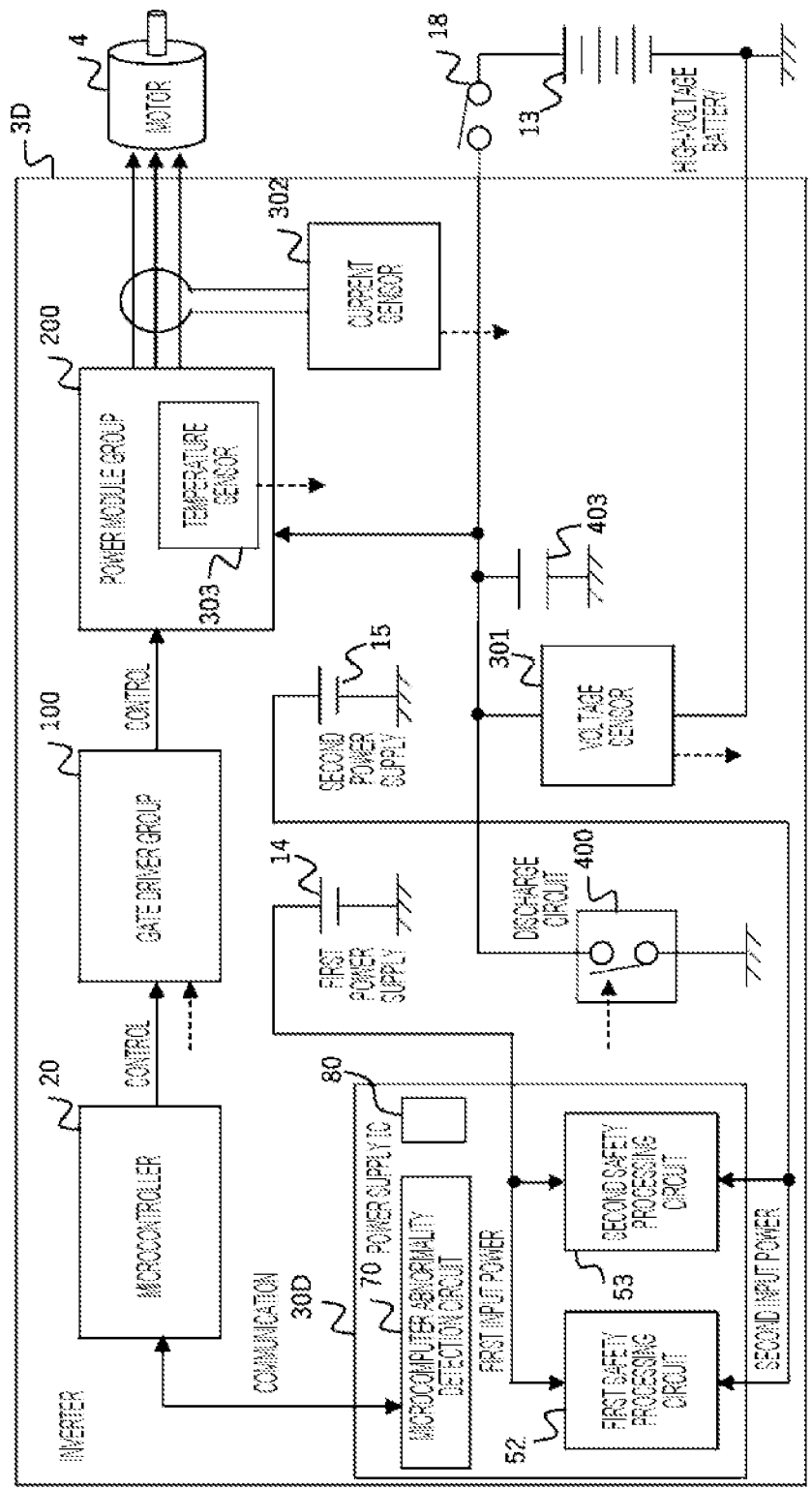
FIG. 7 is a block diagram illustrating a configuration of an inverter in a fourth embodiment.

FIG. 7 is a configuration diagram of an inverter 3D in the fourth embodiment. The inverter 3D in the present embodiment includes a first power supply 14 and a second power supply 15 different from the first power supply 14, in addition to the configuration in the third embodiment. The first power supply 14 supplies a first input power to the first safety processing circuit 52 and the second safety processing circuit 53. The second power supply 15 supplies a second input power to the first safety processing circuit 52 and the second safety processing circuit 53. The first safety processing circuit 52 and the second safety processing circuit 53 can operate by being supplied with at least one of the first input power and the second input power. In other words, the first safety processing circuit 52 and the second safety processing circuit 53 can continue the operation even when power feeding from one of the first power supply 14 and the second power supply 15 is interrupted.

Note that, in FIG. 7, the connection between the voltage sensor 301 and the first safety processing circuit 52 and the second safety processing circuit 53, the connection between the current sensor 302 and the first safety processing circuit 52, the connection between the temperature sensor 303 and the first safety processing circuit 52, the connection between the second safety processing circuit 53 and the discharge circuit 400, and the connection between the first safety processing circuit 52 and the gate driver group 100 are omitted for convenience of drawing. Instead, the voltage sensor 301, the current sensor 302, the temperature sensor 303, the discharge circuit 400, and the gate driver group 100 are indicated by broken arrows to indicate that there is transmission and reception of information omitted.

According to the fourth embodiment described above, the following operational effects can be obtained.

(6) The first input power of the first power supply 14 and the second input power of the second power supply 15 different from the first power supply 14 are supplied to the first safety processing circuit 52 and the second safety processing circuit 53. Even when any one of the two power sources is no longer fed with power due to, for example, disconnection or the like, the operations of the first safety processing circuit 52 and the second safety processing circuit 53 are maintained by any one of the power sources that are not disconnected. Therefore, it is possible to improve reliability of important functions related to functional safety, such as a control function for safely handling a high voltage and a control function for controlling the vehicle to be in a safe state when an abnormality occurs.

Note that, in the present embodiment, a power supply IC 30D includes the first safety processing circuit 52 and the second safety processing circuit 53, but may include at least one of the first safety processing circuit 52 and the second safety processing circuit 53. In addition, when the power supply IC 30D includes the first safety processing circuit 52 and the second safety processing circuit 53, at least one of the first safety processing circuit 52 and the second safety processing circuit 53 may be configured to be fed with power from both the first power supply 14 and the second power supply 15.

Fifth Embodiment

A fifth embodiment of the inverter will be described with reference to FIG. 8. In the following description, the same components as those of the fourth embodiment are denoted by the same reference numerals, and differences will be mainly described. The points not specifically described are the same as those in the fourth embodiment. The present embodiment is different from the fourth embodiment mainly in that a separate power supply is not provided.

Figure 8:
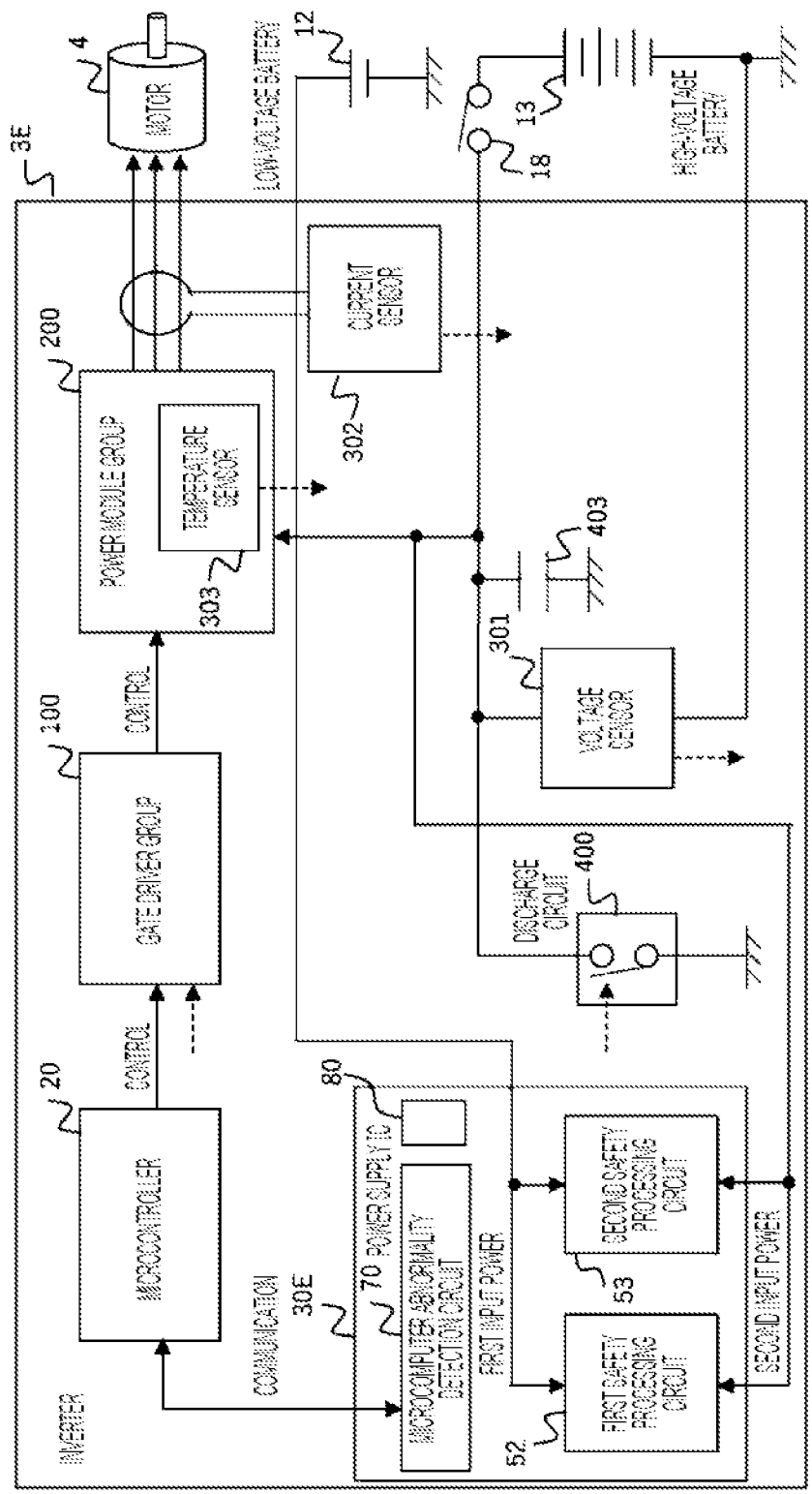
FIG. 8 is a block diagram illustrating a configuration of an inverter in a fifth embodiment.

FIG. 8 is a configuration diagram of an inverter 3E in the fifth embodiment. However, in FIG. 8, as in FIG. 7, some connections are omitted for convenience of drawing, and the presence of information transfer is indicated by a broken line arrow. In the present embodiment, the low-voltage battery 12 substitutes for the first power supply 14 in the fourth embodiment. The high-voltage battery 13 is substituted for the second power supply 15 in the fourth embodiment. That is, in the present embodiment, a redundant power supply can be configured using an existing battery. Note that, as described with reference to FIG. 3, strictly speaking, power supply from the low-voltage battery 12 is fed to the power supply generation unit 80. However, in FIG. 8, in order to clearly show that there are two systems, power is fed without passing through the power supply generation unit 80.

According to the fifth embodiment described above, the following operational effects can be obtained.

(7) The first power supply 14 is the low-voltage battery 12. The second power supply 15 is the high-voltage battery 13 that supplies power to the power module group 200 and has a voltage higher than that of the low-voltage battery 12. The first safety processing circuit 52 and the second safety processing circuit. 53 continue the operations by being supplied with power from either the low-voltage battery 12 or the high-voltage battery 13. Therefore, the first safety processing circuit 52 and the second safety processing circuit 53 can be operated using a battery already mounted on the vehicle without newly providing a power source.

Note that, in the present embodiment, a power supply IC 30E includes the first safety processing circuit 52 and the second safety processing circuit 53, but may include at least one of the first safety processing circuit 52 and the second safety processing circuit 53. In addition, when the power supply IC 30E includes the first safety processing circuit 52 and the second safety processing circuit 53, at least one of the first safety processing circuit 52 and the second safety processing circuit 53 may be configured to be fed with power from both the low-voltage battery 12 and the high-voltage battery 13.

Sixth Embodiment

A sixth embodiment of the inverter will be described with reference to FIG. 9. In the following description, the same components as those of the fifth embodiment are denoted by the same reference numerals, and differences will be mainly described. The points not specifically described are the same as those in the fifth embodiment. In the present embodiment, in the fifth embodiment, an example in which the safety processing circuit is mainly configured by an unchangeable logic gate is illustrated.

Figure 9:
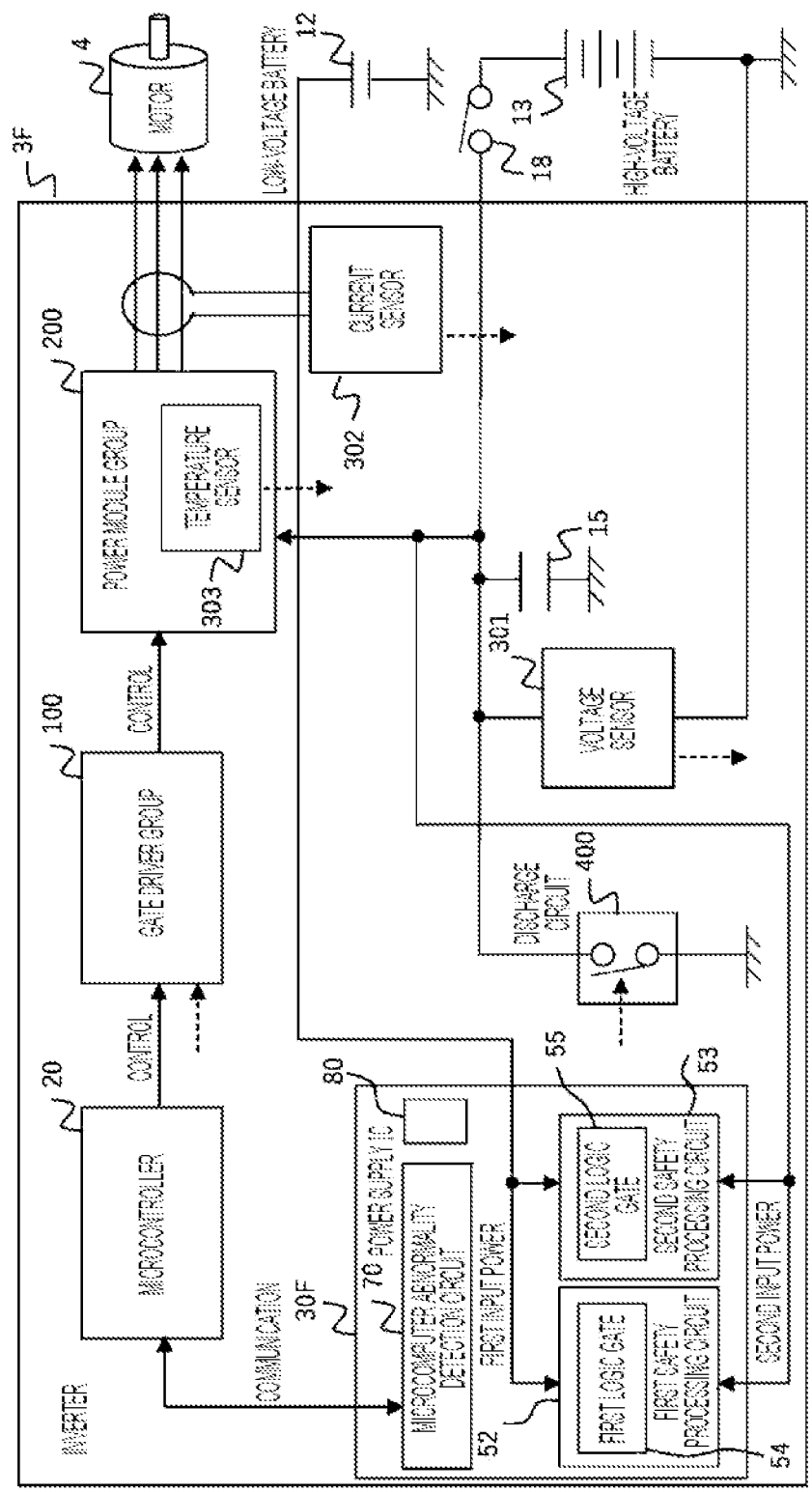
FIG. 9 is a block diagram illustrating a configuration of an inverter in a sixth embodiment.

FIG. 9 is a configuration diagram of an inverter 3F in the sixth embodiment. However, in FIG. 9, as in FIG. 7, some connections are omitted for convenience of drawing, and the presence of information transfer is indicated by a broken line arrow. In the inverter 3B in the fifth embodiment, the first safety processing circuit 52 includes a first logic gate 54, the second safety processing circuit 53 includes a second logic gate 55, and the first logic gate 54 and the second logic gate 55 are unchangeable logic gates.

According to the sixth embodiment described above, the following operational effects can be obtained.

(8) The logic of the first safety processing circuit 52 and the second safety processing circuit 53 is set in a non-rewritable state. Therefore, since the operations of the first safety processing circuit 52 and the second safety processing circuit 53 cannot be rewritten, it is possible to prevent loss of a safety function, runaway of a vehicle, and the like due to erroneous writing.

Note that, in the present embodiment, a power supply IC 30F includes the first safety processing circuit 52 and the second safety processing circuit 53, but may include at least one of the first safety processing circuit 52 and the second safety processing circuit 53. In addition, when the power supply IC 30F includes the first safety processing circuit 52 and the second safety processing circuit 53, only one of the first safety processing circuit 52 and the second safety processing circuit 53 may be configured to include a logic gate.

Seventh Embodiment

A seventh embodiment of the inverter will be described with reference to FIG. 10. In the following description, the same components as those of the sixth embodiment are denoted by the same reference numerals, and differences will be mainly described. The points not specifically described are the same as those in the sixth embodiment. The present embodiment is different from the sixth embodiment mainly in that the power supply IC includes a nonvolatile memory that can be written only once.

Figure 10:
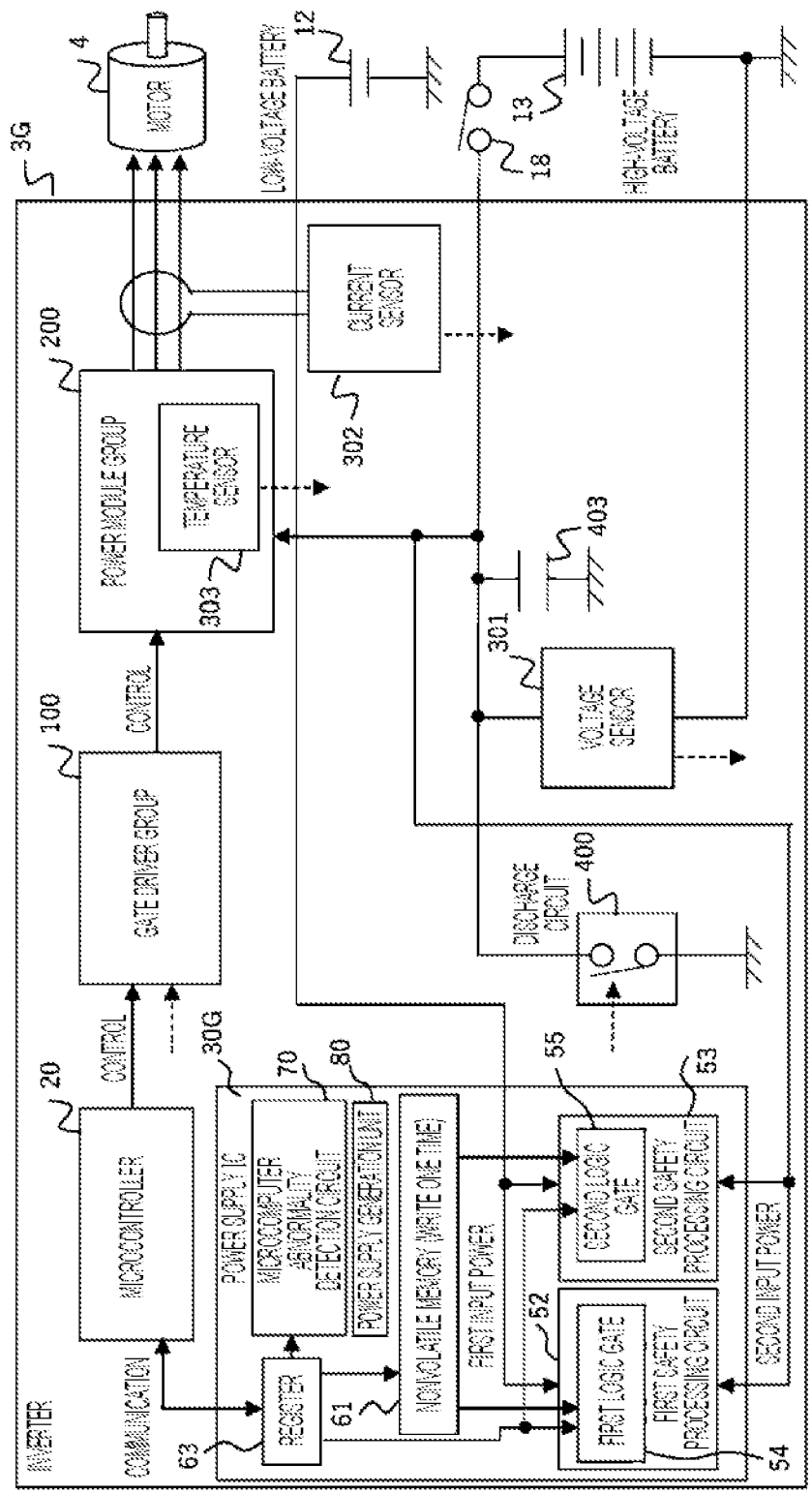
FIG. 10 is a block diagram illustrating configuration of an inverter in a seventh embodiment.

FIG. 10 is a configuration diagram of an inverter 3G in the seventh embodiment. However, in FIG. 10, as in FIG. 7, some connections are omitted for convenience of drawing, and the presence of information transfer is indicated by a broken line arrow. A power supply IC 30G further includes, in addition to the configuration of the power supply IC 30F in the sixth embodiment, a register that 63 stores data communicated with the microcontroller 20, and a nonvolatile memory 61 capable of writing data only once. Data can be written to the nonvolatile memory 61 from the microcontroller 20 via the register 63.

The operations of the first logic gate 54 and the second logic gate 55 are determined based on information stored in at least one of the nonvolatile memory 61 and the register 63. For example, the information stored in the register 63 may be read into the first logic gate 54 and the second logic gate 55 in preference to the information stored in the nonvolatile memory 61, or the information stored in the nonvolatile memory 61 may be read into the first logic gate 54 and the second logic gate 55 in preference to the information stored in the register 63.

In addition, the information stored in the nonvolatile memory 61 may be used only for setting a safety processing operation that needs to be operated at a minimum when one of the first power supply input and the second power supply input is cut off. In this case, by setting the other safety processing operations by the register 63, the capacity of the nonvolatile memory 61 mounted on the power supply IC 30G can be minimized.

According to the seventh embodiment described above, the following operational effects can be obtained.

(9) The logic of the first safety processing circuit 52 and the second safety processing circuit 53 is set in a rewritable state using an interface mounted on the microcontroller 20 existing outside the power supply IC 30G. Therefore, different functions can be set for each vehicle using the same semiconductor chip. More specifically, the processing contents of the first safety processing circuit 52 and the second safety processing circuit 53 can be easily programmed from the microcontroller 20 via the interface with the microcontroller 20 held by the power supply IC 30G.

(10) In the power supply IC 30G, the nonvolatile memory 61 capable of writing only once is mounted. The first safety processing circuit 52 and the second safety processing circuit 53 include a logic gate in which logic is set on the basis of information stored in a nonvolatile memory. Therefore, since the writing is limited to one time, it is possible to prevent loss of a safety function, runaway of a vehicle, and the like due to erroneous writing after setting once.

Note that, in the present embodiment, the power supply IC 30G includes the first safety processing circuit 52 and the second safety processing circuit 53, but may include at least one of the first safety processing circuit 52 and the second safety processing circuit 53. In addition, when the power supply IC 30G includes the first safety processing circuit 52 and the second safety processing circuit 53, only one of the first safety processing circuit 52 and the second safety processing circuit 53 may be configured to include a logic gate.

Eighth Embodiment

An eighth embodiment of the inverter will be described with reference to FIG. 11. In the following description, the same components as those of the seventh embodiment are denoted by the same reference numerals, and differences will be mainly described. The points not specifically described are the same as those in the seventh embodiment. The present embodiment is different from the seventh embodiment mainly in that writing to a nonvolatile memory can be performed a plurality of times.

Figure 11:
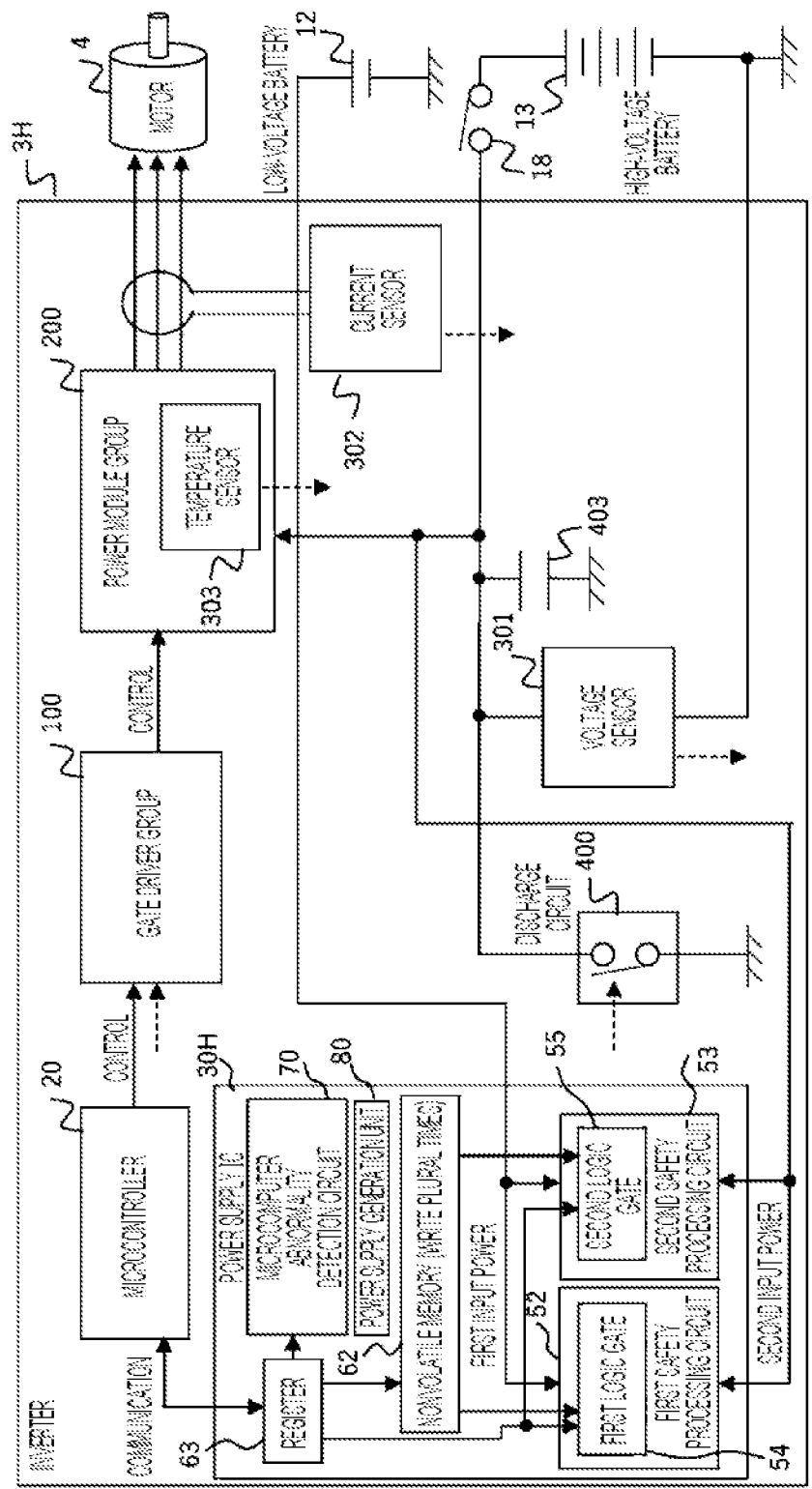
FIG. 11 is a block diagram illustrating a configuration of an inverter in an eighth embodiment.

FIG. 11 is a configuration diagram of an inverter 3H in the eighth embodiment. However, in FIG. 11, as in FIG. 7, some connections are omitted for convenience of drawing, and the presence of information transfer is indicated by a broken line arrow. The inverter 3H in the present embodiment is different from the seventh embodiment in that a nonvolatile memory 62 included in a power supply IC 30H can perform writing a plurality of times. The other points are similar to those of the seventh embodiment, and thus the description thereof will be omitted.

According to the eighth embodiment described above, the following operational effects can be obtained.

(11) In the power supply IC 30H, the nonvolatile memory 62 capable of performing writing a plurality of times is mounted. The first safety processing circuit 52 and the second safety processing circuit 53 include a logic gate in which logic is set on the basis of information stored in a nonvolatile memory. Therefore, it is possible to cope with the change of the safety function request. This effect is described in a generalized manner as follows. That is, the processing contents of the first safety processing circuit 52 and the second safety processing circuit 53 can be easily programmed from the microcontroller 20 via the interface with the microcontroller 20 held by the power supply IC 30H.

In the related art, an example is known in which the first safety processing circuit 52 and the second safety processing circuit 63 exist outside the power supply IC 30H and are configured by a programmable circuit such as an FPGA and a CPLD. In this case, at the time of shipment of a product, for example, the program is performed for each product using a joint test action group (JTAG) interface attached to the FPGA or the CPLD or an interface with an external memory. However, this method has a problem that it is difficult to change the program once the program is executed and the manufacturing is completed or after the program is shipped to the market.

The power supply IC 30H according to the present embodiment can set functions of the first safety processing circuit 52 and the second safety processing circuit 53 based on information received from the microcontroller 20 by communication. Therefore, for example, the first safety processing circuit 52 and the second safety processing circuit 53 can be reprogrammed after manufacture. In addition, the first safety processing circuit 52 and the second safety processing circuit 53 can be reprogrammed even after shipment to the market by using an over the air (OTA) technology for wirelessly updating software of an automobile.

Note that, in the present embodiment, the power supply IC 30H includes the first safety processing circuit 52 and the second safety processing circuit 53, but may include at least one of the first safety processing circuit 52 and the second safety processing circuit 53. In addition, when the power supply IC 30H includes the first safety processing circuit 52 and the second safety processing circuit 53, only one of the first safety processing circuit 52 and the second safety processing circuit 53 may be configured to include a logic gate.

Ninth Embodiment

A ninth embodiment of the inverter will be described with reference to FIG. 12. In the following description, the same components as those of the seventh embodiment are denoted by the same reference numerals, and differences will be mainly described. The points not specifically described are the same as those in the seventh embodiment. The present embodiment is different from the seventh embodiment mainly in that a nonvolatile memory is not provided.

Figure 12:
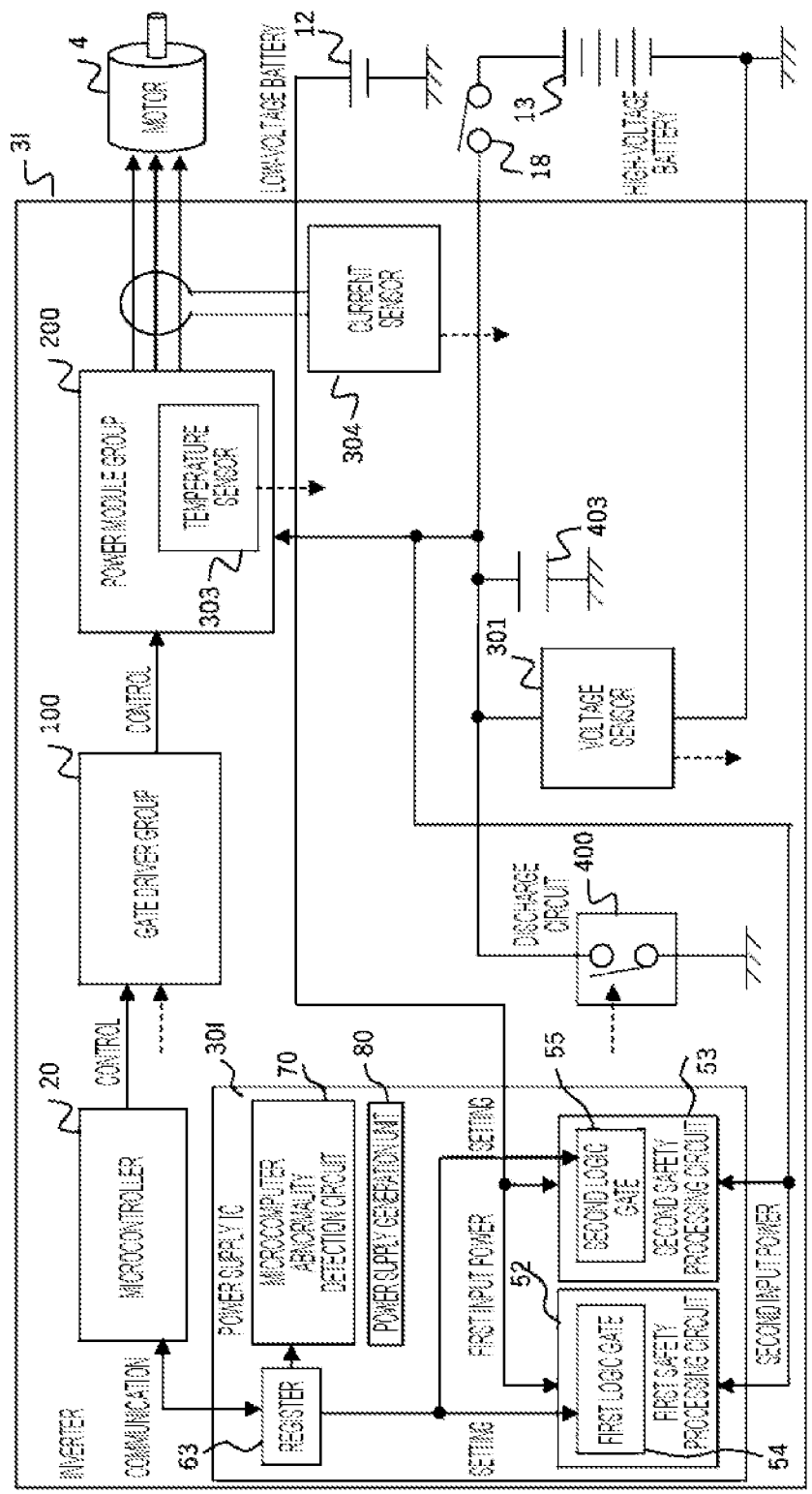
FIG. 12 is a block diagram illustrating configuration of an inverter in a ninth embodiment.

FIG. 12 is a configuration diagram of an inverter 3I in the ninth embodiment. However, in FIG. 12, as in FIG. 7, some connections are omitted for convenience of drawing, and the presence of information transfer is indicated by a broken line arrow. Unlike the seventh embodiment, the inverter 3I in the embodiment does not include a nonvolatile memory in a power supply IC 30I, and the operations of the first logic gate 54 and the second logic gate 55 are determined by the information stored in the register 63. Therefore, in the present embodiment, the microcontroller 20 writes information defining the operations of the first logic gate 54 and the second logic gate 55 in the register 63 each time the inverter 3I is activated.

According to the ninth embodiment described above, the following operational effects can be obtained.

(12) The register 63 is mounted on the power supply IC 30I. The first safety processing circuit 52 and the second safety processing circuit 53 include a logic gate in which logic is set on the basis of information written in the register 63 from the outside. Therefore, it is possible to cope with the change of the safety function request. This effect is described in a generalized manner as follows. That is, the processing contents of the first safety processing circuit 52 and the second safety processing circuit 53 can be easily programmed from the microcontroller 20 via the interface with the microcontroller 20 held by the power supply IC 30I.

Note that, in the present embodiment, the power supply IC 30I includes the first safety processing circuit 52 and the second safety processing circuit 53, but may include at least one of the first safety processing circuit 52 and the second safety processing circuit 53. In addition, when the power supply IC 30I includes the first safety processing circuit 52 and the second safety processing circuit 53, only one of the first safety processing circuit 52 and the second safety processing circuit 53 may be configured to include a logic gate.

Tenth Embodiment

A tenth embodiment of the inverter will be described with reference to FIG. 13. In the following description, the same components as those of the eighth embodiment are denoted by the same reference numerals, and differences will be mainly described. The points not specifically described are the same as those in the eighth embodiment. The present embodiment is different from the eighth embodiment mainly in that rewriting propriety of a nonvolatile memory is controlled.

Figure 13:
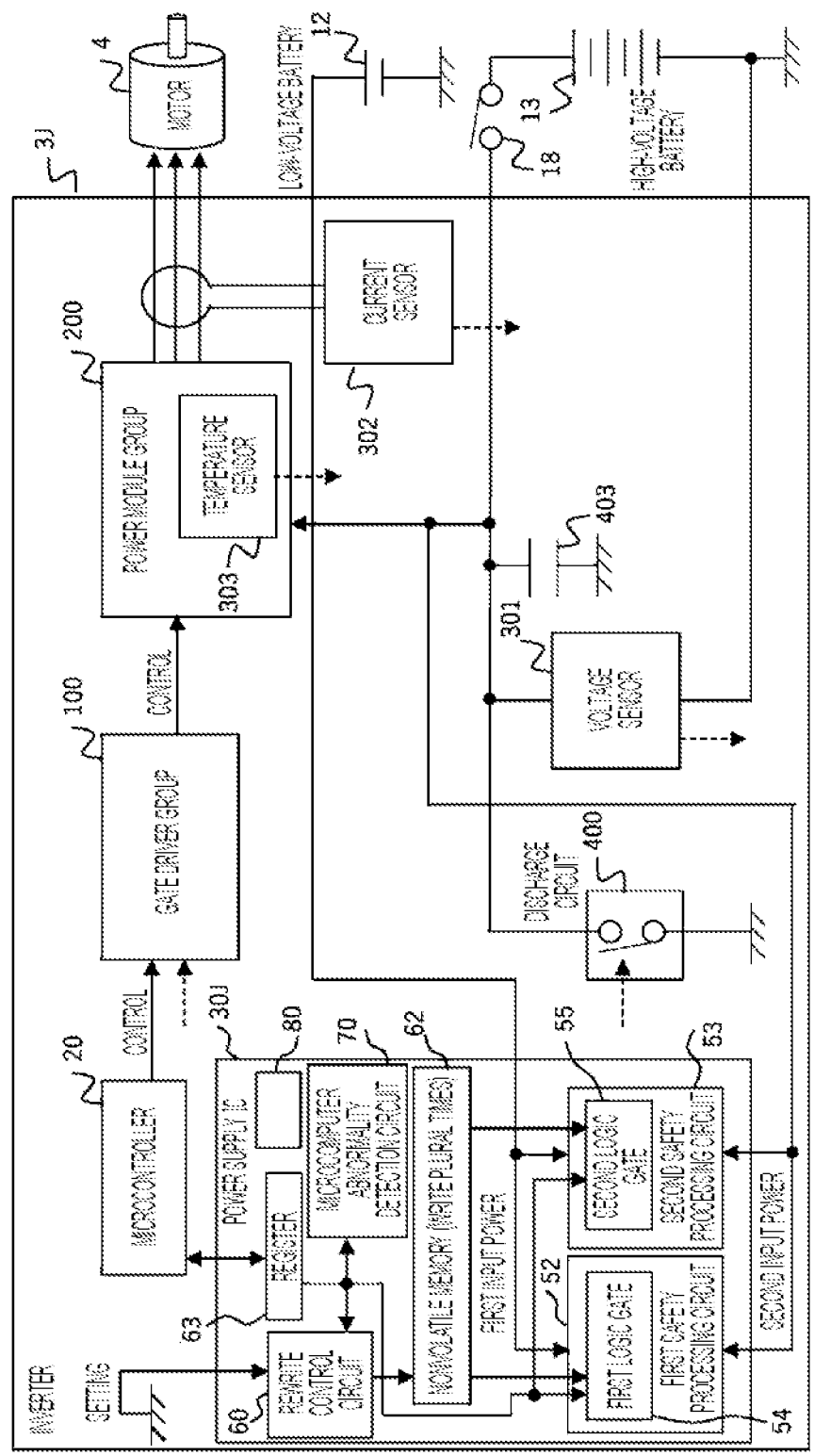
FIG. 13 is a block diagram illustrating configuration of an inverter in a tenth embodiment.

FIG. 13 is a configuration diagram of an inverter 30 in the tenth embodiment. However, in FIG. 13, as in FIG. 7, some connections are omitted for convenience of drawing, and the presence of information transfer is indicated by a broken line arrow. The inverter 3J in the present embodiment is different from the eighth embodiment in that the power supply IC 30J further includes a rewrite control circuit 60. In the present embodiment, writing to the nonvolatile memory 104 can be performed only by the rewrite control circuit 60.

The rewrite control circuit 60 writes the information written in the specific region of the register 63 to the nonvolatile memory 62. However, the rewrite control circuit 60 has an input for state setting, and performs writing to the nonvolatile memory 62 when the input for state setting is at the High level, and does not perform writing to the nonvolatile memory 62 when the input for state setting is at the Low level, for example, the GND level. The input for state setting may be input from, for example, a terminal of the power supply IC 30J, may be input by communication from the microcontroller 20, or may be input from the register 63. Further, it may be input from the nonvolatile memory 62. In this case, the rewrite control circuit 60 determines whether writing to the nonvolatile memory 62 is enabled or disabled by using the information stored in the nonvolatile memory 62.

According to the tenth embodiment described above, the following operational effects can be obtained.

(13) The power supply IC 30J includes the rewrite control circuit 60 that controls prohibition of writing to the nonvolatile memory 62 and permission of writing to the nonvolatile memory 62. Therefore, it is also possible to cope with the change of the safety function request, and erroneous writing can be prevented by setting the write prohibition.

Note that, in the present embodiment, the power supply IC 30O includes the first safety processing circuit 52 and the second safety processing circuit 53, but may include at least one of the first safety processing circuit 52 and the second safety processing circuit 53. In addition, when the power supply IC 30J includes the first safety processing circuit 52 and the second safety processing circuit 53, only one of the first safety processing circuit 52 and the second safety processing circuit 53 may be configured to include a logic gate.

Eleventh Embodiment

An eleventh embodiment of the inverter will be described with reference to FIG. 14. In the following description, the same components as those on the first embodiment are denoted by the same reference numerals, and differences will be mainly described. The points that are not particularly described are the same as in the first embodiment. The present embodiment is different from the first embodiment mainly in that the configurations of a plurality of embodiments after the second embodiment are included.

Figure 14:
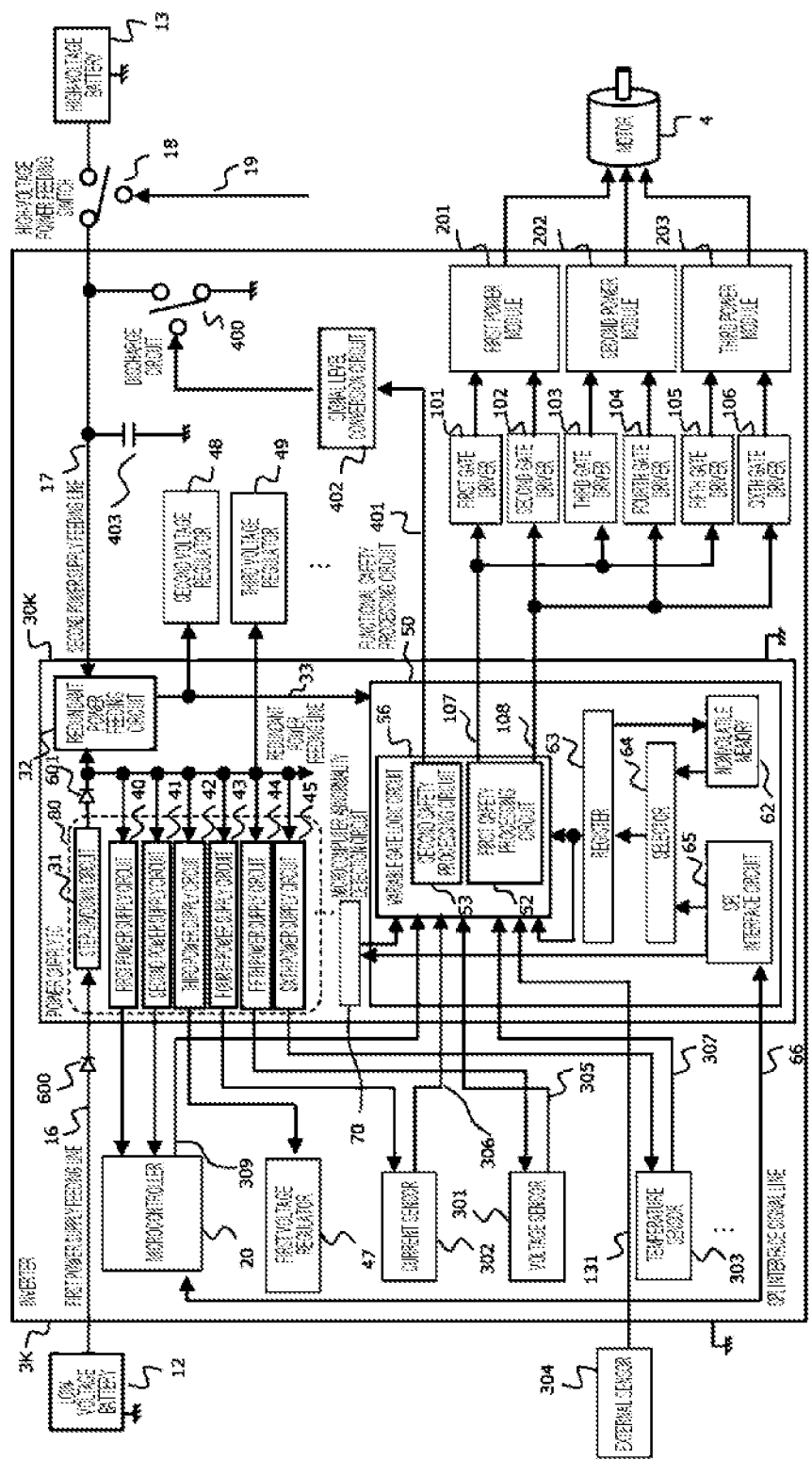
FIG. 14 is a block diagram illustrating a configuration of an inverter in an eleventh embodiment.

FIG. 14 is a configuration diagram of an inverter 3K in the eleventh embodiment. A power supply IC 30K of the inverter 3K is similar to that of the third embodiment in that it includes the first safety processing circuit 52 and the second safety processing circuit 53. The inverter 3K is similar to the fifth embodiment in that the first safety processing circuit 52 and the second safety processing circuit 53 is fed with power from the low-voltage battery 12 and the high-voltage battery 13. The power supply IC 30K includes the power supply generation unit 80, a redundant power feeding circuit 32, and a functional safety processing circuit 50. The functional safety processing circuit 50 includes a nonvolatile memory 62, a register 63, a selector 64, and an SPI interface circuit 65.

The power supply IC 30K mounted on the inverter 3K is supplied with a voltage generated by the low-voltage battery 12 as a first power supply via a first diode 600 for battery reverse connection protection by a first power supply feeding line 16. In addition, a voltage generated by the high-voltage battery 13 as a second power supply is supplied to the power supply IC 30K by a second power supply feeding line 17 via a high-voltage power feeding switch 18. The voltage level of the power supplied from the low-voltage battery 12 to the power supply IC 30K is converted by the step-up/down circuit 31, and the power is input to the redundant power feeding circuit 32 via a second diode 601 for preventing the reverse flow of the current.

The power supplied from the high-voltage battery 13 to the power supply IC 30K is input to the redundant power feeding circuit 32. The voltage level of the power supplied from the low-voltage battery 12 to the power supply IC 30K is converted through the step-up/down circuit 31. Then, the power is supplied to the first power supply circuit 40 to the sixth power supply circuit 45, and a third voltage regulator 49, which is a power supply circuit outside the power supply IC, via the second diode 601 for preventing backflow of current.

The redundant power feeding circuit 32 is a circuit having a function of continuing power feeding with only the other power even when one of the input power is not supplied. The redundant power feeding circuit 32 supplies power to the functional safety processing circuit 50 via a redundant power feeding line 33, and also supplies power to a second voltage regulator 48 mounted on the inverter 3K.

In the functional safety processing circuit 50, a variable gate logic circuit 56 outputs a control signal according to the input based on a combination of one or more signals of the input signals. The input signals to the functional safety processing circuit 50 are, for example, a microcomputer error detection signal 309 indicating that the microcontroller 20 has detected an abnormality, an output of the microcomputer abnormality detection circuit 70, an abnormal current detection signal 306 indicating that the current sensor 302 has detected an abnormal current, a voltage level signal 305 indicating a level of a voltage observed by the voltage sensor 301, an abnormal temperature detection signal 307 indicating that the temperature sensor 303 has detected an abnormal temperature, an external sensor abnormality detection signal 131 indicating that the external sensor 304 outside the inverter 3 has detected some abnormality, and a signal from the register 63.

The variable gate logic circuit 56 is a logic circuit capable of reconfiguring logic according to the value of the register 63. As the value of the register 63, either the value stored in the nonvolatile memory 62 or the value input via the SPI interface circuit 65 is selected and input by the selector 64.

Since the functional safety processing circuit 50 includes the nonvolatile memory 62, it is possible to program the operation of the variable gate logic circuit 56 in advance according to different control methods for different users. Since the functional safety processing circuit 50 includes the SPI interface circuit 65 which is an interface with the outside, the operation of the variable gate logic circuit 56 can be temporarily reconfigured by changing the value set to the register 63 from the microcontroller 20 even after the program is performed in the nonvolatile memory 62.

The nonvolatile memory 62 is a multi-time programmable (MTP) memory in which a value can be written a plurality of times after the power supply IC 30K is manufactured. However, the nonvolatile memory 62 may be a read only memory (ROM) in which a value stored in a memory is built in the process of manufacturing the power supply IC 30K and the value cannot be rewritten, or may be a one time programmable (OTP) memory in which a value can be written only once after manufacturing the power supply IC 30K.

The SPI interface circuit 65 connected to the microcontroller 20 via an SPI interface signal line 66, and performs writing to the register 63 through the microcontroller 20. The SPI interface circuit 65 can perform programming into the nonvolatile memory 62 and read a programmed value.

The SPI interface circuit 65 may be an interface circuit corresponding to another communication protocol, for example, an I2C interface.

The functional safety processing circuit 50 outputs a discharge control. 401, a first gate driver control signal 107, and a second gate driver control signal 108 from the variable gate logic circuit 56 based on the received signal and the value set in the register 63.

The discharge control signal 401 is transmitted to the discharge circuit 400 via a signal level conversion circuit 402. When the functional safety processing circuit 50 detects an abnormality, the high-voltage power feeding switch 18 controlled by a high-voltage power feeding control signal 19 is opened, and the second power supply feeding line 17 is disconnected from the high-voltage battery 13. At this time, the electric charge stored in the capacitor 403 of the second power supply feeding line 17 is discharged by the operation of the discharge circuit 400.

The first gate driver control signal 107 and the second gate driver control signal 108 control the first power module 201 to the third power module 203 via the first gate driver 101 to the sixth gate driver 106. As a result, when an abnormality in the functional safety processing circuit 50 is detected, the motor 4 can be safely stopped.

Note that the external sensor 304 is installed outside the inverter 3, is used when it is desired to use information outside the inverter for the operation of the functional safety processing circuit 50, and is not necessarily provided.

According to the eleventh embodiment described above, it is possible to obtain the functions and effects of the third, fifth, and eighth embodiments described above. Note that, in the present embodiment, the power supply IC 30K includes the first safety processing circuit 52 and the second safety processing circuit 53, but may include at least one of the first safety processing circuit 52 and the second safety processing circuit 53.

In the embodiment and the modification described above, control lines and information lines considered to be necessary for the description are illustrated, and not all the control lines and information lines are necessarily illustrated in the product. Further, the present invention is not limited to the above embodiments, and various modifications may be contained. For example, the above-described embodiments have been described in detail in order to help understanding of the present invention, and are not necessarily limited to those having all the described configurations. In addition, some of the configurations of a certain embodiment may be replaced with the configurations of the other embodiments, and the configurations of the other embodiments may be added to the configurations of the subject embodiment. It is possible to add, delete, and replace other configurations for a part of the configuration of each embodiment.

In the above-described embodiments and modifications, the configuration of the functional block is merely an example. Some functional configurations illustrated as separate functional blocks may be integrally configured, or a configuration illustrated in one functional block diagram may be divided into two or more functions. In addition, some of the functions of each functional block may be included in another functional block.

The above-described embodiments and modifications may be combined with each other. Various embodiments and modifications have been described, but the present invention is not limited to these contents. Other aspects which are conceivable within a scope of technical ideas of the present invention may be made within the scope of the present invention.

REFERENCE SIGNS LIST 3, 3A to 3K inverter
4 motor
12 low-voltage battery
13 high-voltage battery
14 first power supply
15 second power supply
20 microcontroller
50 functional safety processing circuit
51 safety processing circuit
52 first safety processing circuit
53 second safety processing circuit
54 first logic gate
55 second logic gate
56 variable gate logic circuit
60 rewrite control circuit
61 nonvolatile memory
62 nonvolatile memory
63 register
64 selector
70 microcomputer abnormality detection circuit
80 power supply generation unit
100 gate driver group
200 power module group
301 voltage sensor
302 current sensor
303 temperature sensor
400 discharge circuit

The invention claimed is:

1. An electronic control device for power conversion comprising:
a power module configured to convert DC power into AC power and supply the AC power to a motor;
a gate driver configured to control the power module;
a microcontroller configured to control the gate driver;
a power supply IC configured to supply power to at least one of the gate driver and the microcontroller;
a discharge circuit configured to discharge a high voltage supplied to the power module;
a sensor,
a microcomputer abnormality detection circuit configured to detect an abnormality of the microcontroller by using a watchdog timer to constantly communicate with the microcontroller and detect the abnormality when the microcontroller fails to respond within a predetermined period; and
a safety processing circuit configured to determine a necessity of safety processing based on the abnormality and information from the sensor, and
wherein based on the necessity determined, the safety processing circuit is further configured to perform a safety operation that stops the motor or discharges a high voltage using the discharge circuit without utilizing the microcontroller.

2. The electronic control device for power conversion according to claim 1, wherein
the sensor is at least one of a temperature sensor configured to measure a temperature of the power module, a current sensor configured to measure a current supplied to the motor, or a voltage sensor configured to measure a voltage of the high voltage, and
the safety processing circuit is a first safety processing circuit configured to directly control the gate driver not depending on the microcontroller as the safety processing to stop the motor.

3. The electronic control device for power conversion according to claim 1, wherein
the sensor is a voltage sensor configured to measure a voltage of the high voltage, and
the safety processing circuit is a second safety processing circuit configured to cause the discharge circuit to perform discharge as the safety processing.

4. The electronic control device for power conversion according to claim 1, wherein
the sensor is at least one of a temperature sensor configured to measure a temperature of the power module, a current sensor configured to measure a current supplied to the motor, and a voltage sensor configured to measure a voltage of the high voltage, and
the safety processing circuit is a first safety processing circuit configured to directly control the gate driver not depending on the microcontroller as the safety processing to stop the motor, and a second safety processing circuit configured to cause the discharge circuit to perform discharge as the safety processing.

5. The electronic control device for power conversion according to claim 1, wherein a first input power of a first power supply and a second input power of a second power supply different from the first power supply are supplied to the safety processing circuit.

6. The electronic control device for power conversion according to claim 5, wherein
the first power supply is a low-voltage power supply, and
the second power supply is a high-voltage power supply configured to supply power to the power module and have a voltage higher than a voltage of the first power supply, and
the safety processing circuit continues operation by being supplied with power from one of the first power supply and the second power supply.

7. The electronic control device for power conversion according to claim 1, wherein a logic of the safety processing circuit is set in a non-rewritable state.

8. The electronic control device for power conversion according to claim 1, wherein a logic of the safety processing circuit is set in a rewritable state using an interface mounted on an external microcontroller.

9. The electronic control device for power conversion according to claim 8, wherein
the power supply IC is mounted with a nonvolatile memory capable of performing writing only once, and
the safety processing circuit includes a logic gate in which logic is set based on information stored in the nonvolatile memory.

10. The electronic control device for power conversion according to claim 8, wherein
the power supply IC is mounted with a nonvolatile memory capable of performing writing a plurality of times, and
the safety processing circuit includes a logic gate in which logic is set based on information stored in the nonvolatile memory.

11. The electronic control device for power conversion according to claim 10, wherein the power supply IC further includes a rewrite control circuit configured to control prohibition of writing to the nonvolatile memory and permission of writing to the nonvolatile memory.

12. The electronic control device for power conversion according to claim 8, wherein
the power supply IC is mounted with a register, and
the safety processing circuit includes a logic gate in which logic is set based on information written in the register from outside.

13. The electronic control device for power conversion according to claim 1, wherein the safety processing circuit is further configured to cut off power feeding to the gate driver as the safety processing.

14. The power supply IC provided in the electronic control device for power conversion according to claim 1.

* * * * *